(12) United States Patent
Kim et al.

(10) Patent No.: US 11,227,652 B2
(45) Date of Patent: Jan. 18, 2022

(54) MEMORY DEVICE AND METHOD OF OPERATING THE SAME

(71) Applicant: SK hynix Inc., Gyeonggi-do (KR)

(72) Inventors: Sun Hak Kim, Gyeonggi-do (KR); Yong Hwan Hong, Gyeonggi-do (KR); Byung Ryul Kim, Gyeonggi-do (KR); Jae Young Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/997,432

(22) Filed: Aug. 19, 2020

(65) Prior Publication Data
US 2021/0295896 A1 Sep. 23, 2021

(30) Foreign Application Priority Data
Mar. 17, 2020 (KR) .................. 10-2020-0032780

(51) Int. Cl.
*G11C 11/00* (2006.01)
*G11C 11/4093* (2006.01)
(Continued)

(52) U.S. Cl.
CPC ...... *G11C 11/4093* (2013.01); *G06F 11/1004* (2013.01); *G06F 11/1068* (2013.01);
(Continued)

(58) Field of Classification Search
CPC ... G11C 29/76; G11C 13/0004; G11C 15/046; G11C 29/44; G11C 29/4401; G11C 29/78; G11C 7/1006; G11C 7/24; G11C 16/0408; G11C 16/0483; G11C 16/14; G11C 16/20; G11C 16/24; G11C 16/3445; G11C 16/3459; G11C 16/349; G11C 15/04; G11C 11/4085; G11C 11/4093; G11C 11/4097; G11C 29/52; G11C 7/106; G06F 13/385; G06F 13/1668; G06F 13/1694; G06F 11/1004; G06F 11/1068; G03G 15/6529; G03G 2215/00016; G03G 2215/00371;
(Continued)

(56) References Cited

U.S. PATENT DOCUMENTS

| 9,891,976 B2 | 2/2018 | Chen et al. | |
| 2014/0241059 A1* | 8/2014 | Martinozzi | ............ G11C 29/76 365/185.09 |

FOREIGN PATENT DOCUMENTS

KR 10-1486424 1/2015

* cited by examiner

*Primary Examiner* — Thong Q Le
(74) *Attorney, Agent, or Firm* — IP & T Group LLP

(57) ABSTRACT

Provided herein is a memory device and a method of operating the same. The memory device may include a CAM block configured to store CAM data required for various operations, a page buffer group configured to store the CAM data read from the CAM block through a CAM read operation, an extra register configured to store extra data generated by performing an operation on the CAM data, an operation logic configured to perform an operation of checking a defect in the extra register, registers configured to sequentially store operation data generated through the defect check operation, a fixed register configured to store fixed data obtained through an operation performed to check an error in the CAM data, and core circuits configured to perform the CAM read operation and transmit the operation data and the CAM data to the extra register, the registers, and the fixed register.

21 Claims, 16 Drawing Sheets

(51) Int. Cl.
*G11C 11/408* (2006.01)
*G11C 11/4097* (2006.01)
*G06F 11/10* (2006.01)
*G11C 15/04* (2006.01)
*G11C 7/10* (2006.01)

(52) U.S. Cl.
CPC .......... *G11C 7/106* (2013.01); *G11C 11/4085* (2013.01); *G11C 11/4097* (2013.01); *G11C 15/04* (2013.01)

(58) Field of Classification Search
CPC .......... G03G 2215/00383; G03G 2215/00822; G06K 15/02; G06K 15/181; G06K 19/06037; G06K 2215/0082
USPC .............. 365/163, 185.17, 200, 201, 185.03, 365/185.09, 185.12, 189.05, 222, 238.5; 711/E12.001, 103, 117, 108, 104, 711/E12.008, E12.016, E12.017, 101, 711/105, 118, 154, 170
See application file for complete search history.

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0032780, filed on Mar. 17, 2020, which is incorporated herein by reference in its entirety.

BACKGROUND

1. Technical Field

Various embodiments of the present disclosure relate to a memory device and a method of operating the memory device.

2. Related Art

A memory device may include a plurality of memory cells which store data. The memory cells may be implemented as volatile memory cells in which stored data is lost when the supply of power is interrupted or as nonvolatile memory cells into which stored data is retained even when the supply of power is interrupted.

Recently, with an increase in the use of portable electronic devices, the use of a memory device composed of nonvolatile memory cells has gradually increased. Due to the reduction in sizes of electronic devices, a higher integration and a larger capacity of memory devices used in electronic devices became necessary.

In order for a memory device to operate, various set values are needed, and data corresponding to such set values may be stored in a content-addressable memory block (CAM block).

When power is supplied to the memory device, a read operation may be performed on the CAM block, and the read data may be stored in an extra register in the memory device. The data stored in the extra register may be used for various operations during the operation of the memory device.

SUMMARY

Various embodiments of the present disclosure are directed to a memory device, which can check defects occurring in an extra register into which data in a CAM block is loaded, and a method of operating the memory device.

An embodiment of the present disclosure may provide for a memory device. The memory device may include a content-addressable memory (CAM) block configured to store CAM data required for various operations, a page buffer group configured to store the CAM data read from the CAM block through a CAM read operation, an extra register configured to store extra data generated by performing an operation on the CAM data, an operation logic configured to perform a defect check operation of checking a defect occurring in the extra register, registers configured to sequentially store operation data generated through the defect check operation, a fixed register configured to store fixed data obtained through an operation performed to check an error in the CAM data, and core circuits configured to perform the CAM read operation under control of the operation logic and transmit the operation data and the CAM data to the extra register, the registers, and the fixed register.

An embodiment of the present disclosure may provide for a method of operating a memory device. The method may include storing, in a fixed register, fixed data corresponding to a value of a cyclic redundancy check (CRC) that is performed in advance on CAM data stored in a CAM block, generating extra data by performing an operation on the CAM data read from the CAM block, and storing the extra data in an extra register, storing, as page data, the CAM data read from the CAM block in a page buffer group, generating first operation data by performing an operation on the extra data and the page data, generating second operation data by performing an operation on the first operation data and initial second operation data, generating final data by performing an operation on the second operation data and the fixed data, and determining whether a defect has occurred in the extra register depending on the final data.

DETAILED DESCRIPTION

Specific structural or functional descriptions in the embodiments of the present disclosure introduced in this specification or application are mere examples to describe embodiments of the present disclosure. The embodiments of the present disclosure may be practiced in various forms, and should not be construed as being limited to the embodiments described in the specification or application.

Figure 1:
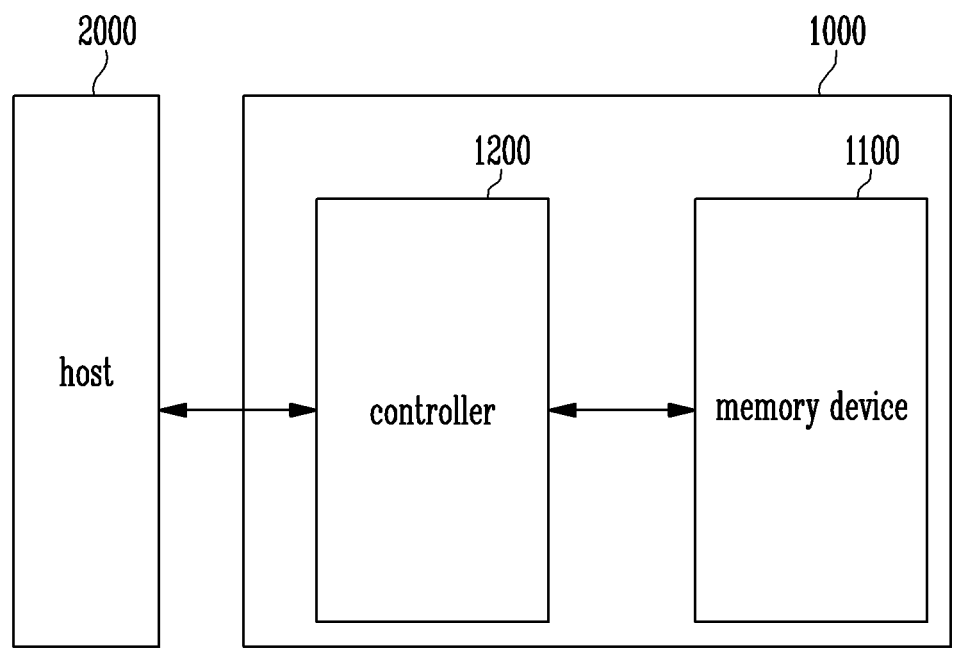
FIG. 1 is a diagram illustrating a memory device according to an embodiment.

FIG. 1 is a diagram illustrating a memory device according to an embodiment of the present disclosure.

A memory system 1000 may include a memory device 1100 which stores data, and a controller 1200 which performs communication between the memory device 1100 and a host 2000.

The memory device 1100 may communicate with the controller 1200 through at least one channel. For example, a command, an address, or data may be transmitted and received through the channel, and the memory device 1100 may be operated in response to the command and the address received through the channel.

The controller 1200 may perform communication between the host 2000 and the memory device 1100. The controller 1200 may control the memory device 1100 in response to a request from the host 2000, or may perform a background operation for improving the performance of the memory system 1000 regardless of a request from the host 2000. The host 2000 may generate requests for various operations, and may transmit the generated requests to the memory system 1000. For example, the requests may include a program request for a program operation, a read request for a read operation, an erase request for an erase operation, etc.

The host 2000 may communicate with the memory system 1000 through various interfaces, such as Peripheral Component Interconnect Express (PCIe), Advanced Technology Attachment (ATA), Serial ATA (SATA), Parallel ATA (PATA), serial attached SCSI (SAS), Non-Volatile Memory Express (NVMe), Universal Serial Bus (USB), Multi-Media Card (MMC), Enhanced Small Disk Interface (ESDI), or Integrated Drive Electronics (IDE).

The above-described memory device 1100 will be described in detail below.

Figure 2:
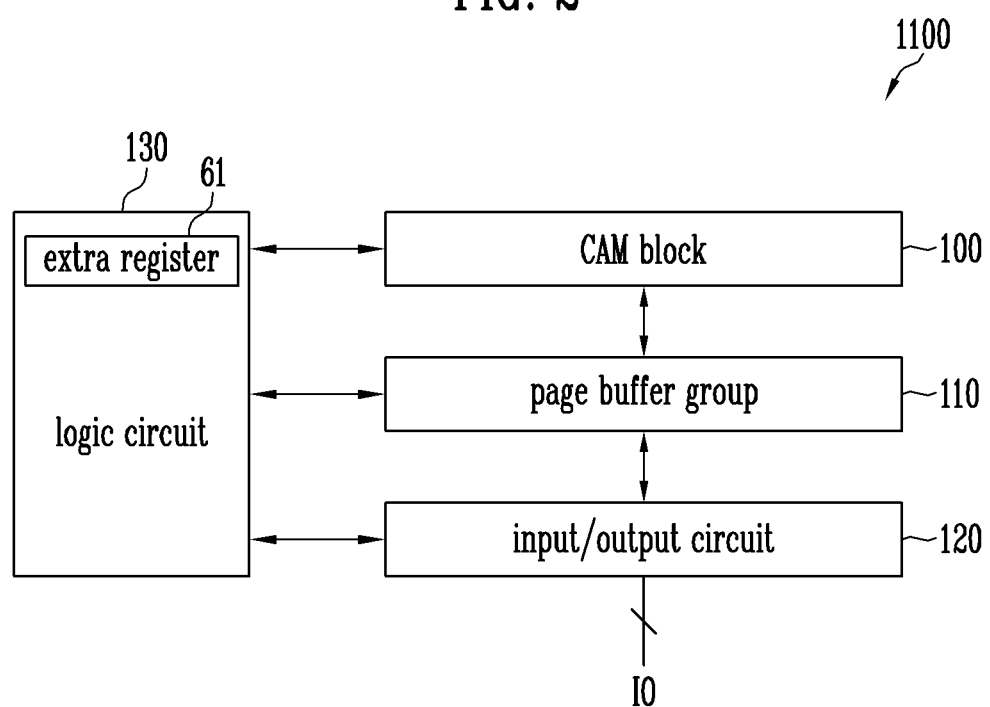
FIG. 2 is a diagram illustrating a memory device.

FIG. 2 is a diagram illustrating a memory device.

Referring to FIG. 2, the memory device 1100 may include a CAM block 100, a page buffer group 110, an input/output circuit 120, and a logic circuit 130.

The CAM block 100 may be any one of a plurality of memory blocks included in the memory device 1100, and may store CAM data other than normal data. The normal data may be data received from a host (e.g., 2000 of FIG. 1), and the CAM data may be system data required for the operation of the memory device 1100. Therefore, the normal data may be stored in normal memory blocks, and the CAM data may be stored in the CAM block 100. The normal memory blocks may be blocks which can be accessed by a user using an address, and the CAM block 100 may be a block which cannot be accessed by the user using an address.

The page buffer group 110 may exchange data with the CAM block 100 through bit lines. For example, the CAM data read from the CAM block 100 may be temporarily stored in the page buffer group 110. In an embodiment, the page buffer group 110 may also be coupled in common to the normal memory blocks through the bit lines.

The input/output circuit 120 may be coupled to an external device through input/output lines JO. In an embodiment, the external device may be a controller (e.g., 1200 of FIG. 1). Therefore, the input/output lines JO may be included in a channel coupled to the controller 1200. The input/output circuit 120 may transfer the normal data, received from the external device, to the page buffer group 110, and may transfer the command and the address to the logic circuit 130. Further, the input/output circuit 120 may output the normal data, received from the page buffer group 110, to the external device through the input/output lines 10.

The logic circuit 130 may output operating voltages to the CAM block 100 or control the page buffer group 110 and the input/output circuit 120 in response to the command received from the input/output circuit 120 or the command and the address received therefrom. The logic circuit 130 may include software corresponding to an algorithm that may be executed in response to the command, and may include hardware that may output signals depending on the algorithm.

The memory device 1100 may include an extra register 61 for the CAM data. For example, when power is supplied to the memory device 1100 and a CAM read command is received from the external device during a boot operation, the memory device 1100 may perform a CAM read operation to use the CAM data stored in the CAM block 100. The CAM read operation may be an operation of reading the CAM data stored in the CAM block 100 and storing the CAM data in the page buffer group 110. That is, during the normal read operation, after the normal data has been stored in the page buffer group 110, the normal data is output to the external device through the input/output circuit 120. However, during the CAM read operation, after the CAM data read from the CAM block 100 has been stored in the page buffer group 110, the CAM data is not transferred to the input/output circuit 120. The CAM data that is read in the CAM read operation may be transmitted to the extra register 61, and the CAM data stored in the extra register 61 may be used as set values for various operations that are performed by the memory device 1100. Since the CAM data is data used even in normal memory devices, detailed descriptions thereof are omitted.

Referring to the embodiment of FIG. 2, the extra register 61 is included in the logic circuit 130. In the following embodiments, the extra register 61 will be described as being a component included in the logic circuit 130. However, the disclosure is not limited thereto. That is, in other embodiments, the extra register 61 may be disposed outside the logic circuit 130.

Figure 3:
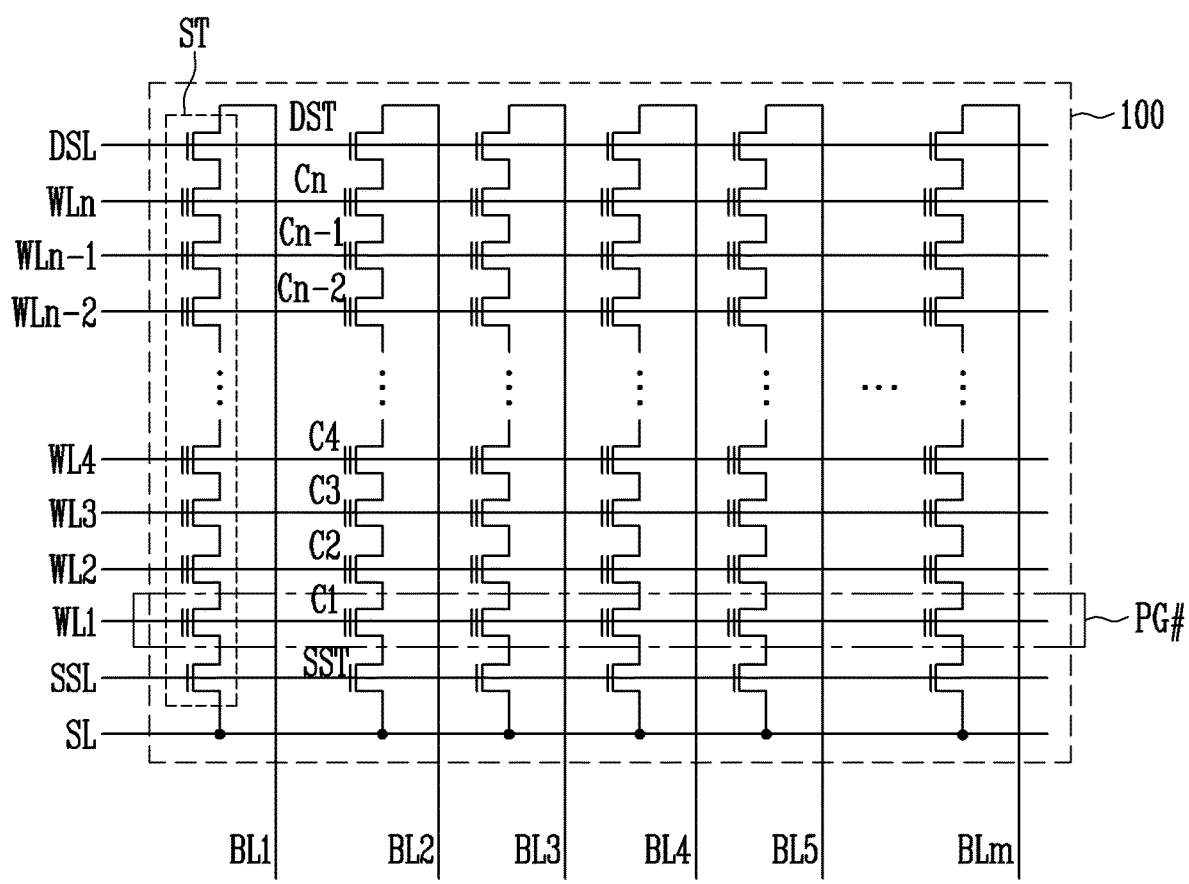
FIG. 3 is a circuit diagram illustrating a CAM block.

FIG. 3 is a circuit diagram illustrating a CAM block.

Referring to FIG. 3, the CAM block 100 may be configured similar to normal memory blocks. For example, the CAM block 100 may include a plurality of strings ST coupled between first to m-th bit lines BL1 to BLm, where m is a positive integer, and a source line SL. Each of the strings ST may include a source select transistor SST, first to n-th CAM cells Cl to Cn, and a drain select transistor DST which are coupled in series between the source line SL and a corresponding bit line of the first to m-th bit lines BL1 to BLm. The CAM cells Cl to Cn may be configured similar to normal memory cells included in the normal memory blocks. In the present embodiment, although the CAM cells are described as being implemented as NAND memory cells, the structure of the CAM cells according to the present embodiment is not limited to NAND memory cells. The strings ST may be respectively coupled to bit lines, and may be coupled in common to the source line SL.

Since the CAM block 100 illustrated in FIG. 3 is a component used to describe the configuration of the block, the numbers of source select transistors SST, first to n-th CAM cells Cl to Cn, and drain select transistors DST are not limited to those illustrated in FIG. 3.

Gates of source select transistors SST coupled to different strings ST may be coupled to a source select line SSL, gates of the first to n-th CAM cells Cl to Cn may be coupled to first to n-th word lines WL1 to WLn, and gates of the drain select transistors DST may be coupled to a drain select line DSL.

A group of CAM cells which are coupled to the same word line and are included in different strings ST may form one page PG #. The CAM cells may be programmed or read on a page PG # basis.

The first to m-th bit lines BL1 to BLm may be coupled to respective page buffers included in the page buffer group 110.

The storage capacity of the above-described page PG # may be determined depending on the number of CAM cells. The storage capacity of the page PG # will be described in detail below.

Figure 4:
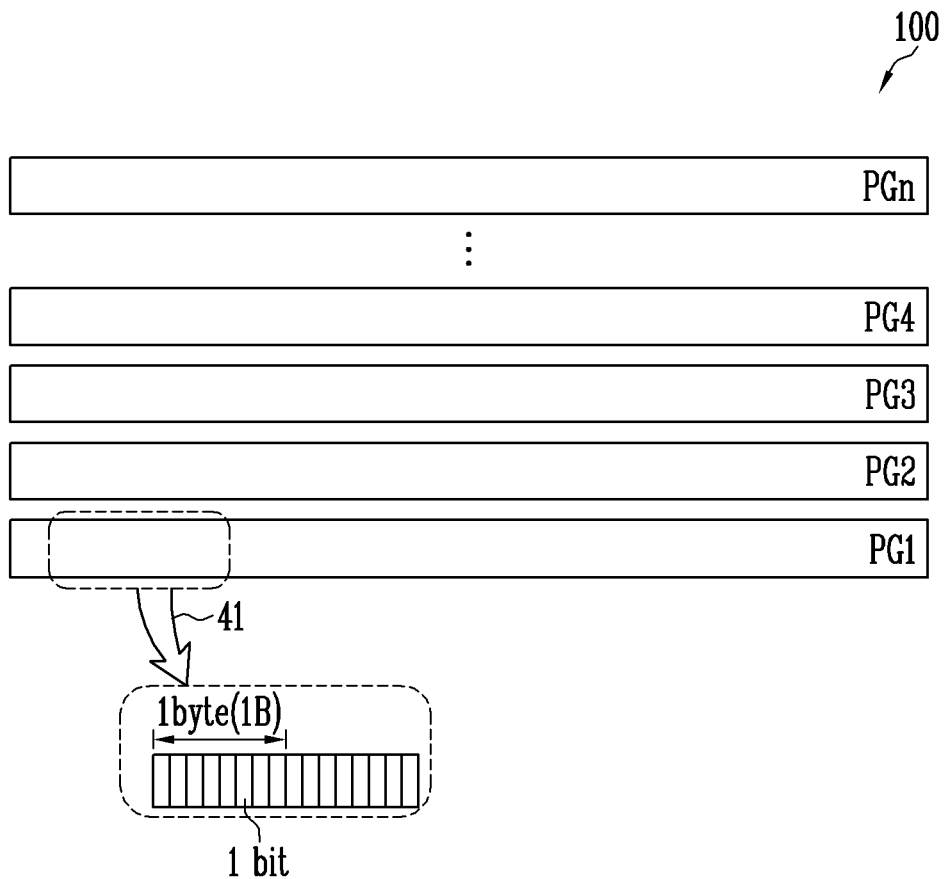
FIG. 4 is a diagram illustrating pages included in a CAM block.

FIG. 4 is a diagram illustrating pages included in a CAM block.

Referring to FIG. 4, when n word lines are coupled to the CAM block 100, n pages may be included in the CAM block depending on the number of word lines. For example, when the first to n-th word lines are coupled to the CAM block 100, first to n-th pages PG1 to PGn may be included in the CAM block 100.

The storage capacity of each of the first to n-th pages PG1 to PGn may be proportional to the number of CAM cells included in the corresponding page. Referring to a part 41 of the first page PG1, the storage capacity of each of CAM cells included in different columns may be 1 bit. Therefore, the total capacity of eight CAM cells may be 1 byte, and the first page PG1 may have a storage capacity of tens to thousands of bytes.

Since CAM data stored in the CAM block 100 contains important information required for the operation of the memory device, the CAM data should have high reliability. Therefore, 1-bit CAM data may be stored in a plurality of CAM cells. That is, the same CAM data may be stored in CAM cells corresponding to 1 byte (1B). For example, when original CAM data is '0 1 0 1', and the same data corresponding to each bit may be stored by 1 byte (1B), the CAM data may be stored as '00000000 11111111 00000000 11111111' in the CAM cells of a selected page.

Further, in order to maintain high reliability, the CAM data may be stored in any one of the first to n-th pages PG1 to PGn, or may be stored in a plurality of pages including one or more erased pages therebetween.

Figure 5:
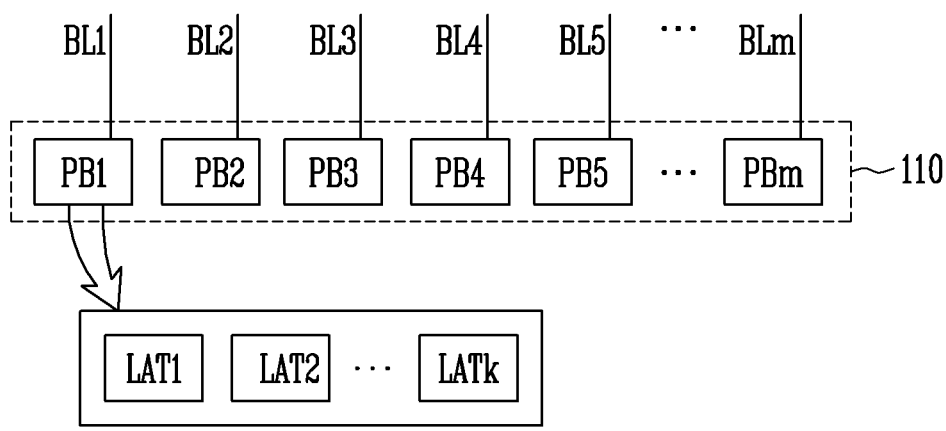
FIG. 5 is a diagram illustrating a page buffer group.

FIG. 5 is a diagram illustrating a page buffer group.

Referring to FIG. 5, the page buffer group 110 may include first to m-th page buffers PB1 to PBm respectively coupled to first to m-th bit lines BL1 to BLm. Each of the first to m-th page buffers PB1 to PBm may include a plurality of latches LAT1 to LATk, where k is a positive integer, which store data. For example, during a program operation, the first to m-th page buffers PB1 to PBm may store data, input from an external device, into a latch selected from among the plurality of latches LAT1 to LATk, and may adjust the voltages of the first to m-th bit lines BL1 to BLm depending on the stored data. During a read operation, the first to m-th page buffers PB1 to PBm may sense the voltages or currents of the first to m-th bit lines BL1 to BLm, and may store data in the latch selected from among the plurality of latches LAT1 to LATk.

During a read operation of a CAM block (e.g., 100 of FIG. 2), the first to m-th page buffers PB1 to PBm may store CAM data, read from the CAM block 100, in the selected latch, and may then transmit the CAM data, stored in the selected latch, to an extra register (e.g., 61 of FIG. 2).

The extra register 61 and a logic circuit (e.g., 130 of FIG. 2) will be described in detail below.

Figure 6:
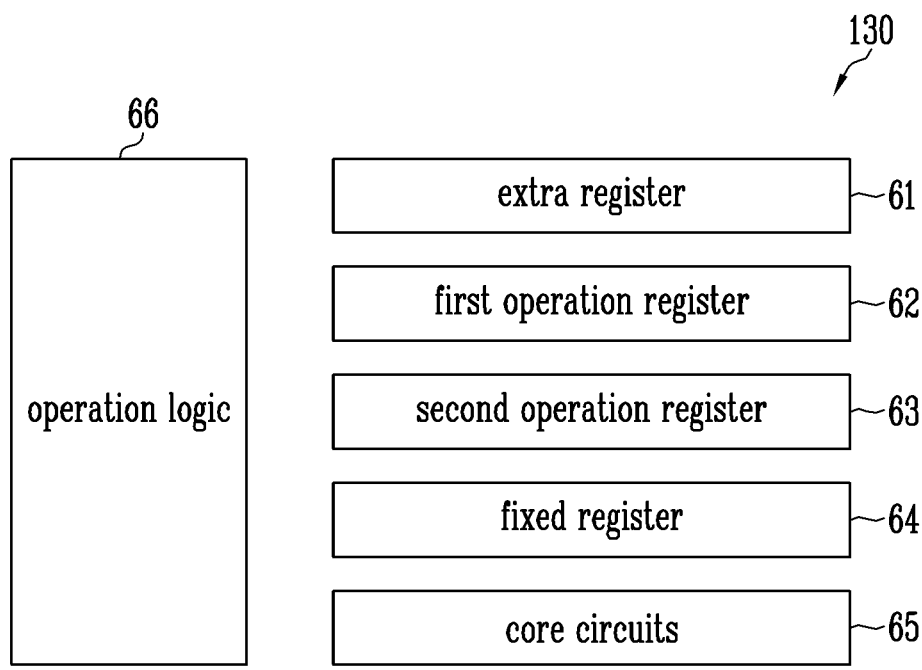
FIG. 6 is a diagram illustrating a logic circuit according to an embodiment.

FIG. 6 is a diagram illustrating a logic circuit according to an embodiment of the present disclosure.

Referring to FIG. 6, the logic circuit 130 may include an extra register 61, a first operation register 62, a second operation register 63, a fixed register 64, core circuits 65, and an operation logic 66.

The extra register 61 may store extra data. The extra data may be resulting data obtained by performing a specific operation on items of CAM data stored in the CAM block 100. For example, resulting data obtained by independently performing an XNOR operation on the items of CAM data stored in the CAM block 100 and the items of initial extra data iDext stored in an extra register 61 may be the extra data. For example, the extra register 61 may be implemented as a static random access memory (SRAM), a dynamic RAM (DRAM) or a latch.

The first operation register 62 and the second operation register 63 may be used to store operation values for checking a defect in the extra register 61.

The fixed register 64 may store fixed data. For example, the fixed data may be data stored in the fixed register 64 at the manufacturing step of the memory device. The fixed data may be data that causes the resulting value of a final XOR operation to be '0' in a cyclic redundancy check (CRC) operation that is performed in advance on the CAM data, which is error-free and stored in the CAM block 100.

The core circuits 65 may include circuits which transmit data among the extra register 61, the first and second operation registers 62 and 63, and the fixed register 64. Also, the core circuit 65 may include circuits that may control the page buffer group 110 and the input/output circuit 120, illustrated in FIG. 2, and may generate operating voltages to be applied to word lines coupled to the CAM block.

The operation logic 66 may control the core circuits 65 in response to a command and an address. The operation logic 66 may include software which may perform various operations, for example, a program operation, a read operation or an erase operation, and hardware which may output various control signals for controlling the core circuits 65 depending on the software. When a CAM read command is received, the operation logic 66 according to the present embodiment may control the core circuits 65 so that a CAM read operation is performed. When CAM data read from the CAM block (e.g., 100 of FIG. 2) is stored in the extra register 61, the operation logic 66 may control the core circuits 65 to check a defect in the CAM data stored in the extra register 61. Also, the operation logic 66 may perform operations on items of data output from the extra register 61, the page buffer group (e.g., 110 of FIG. 5), the first and second operation registers 62 and 63, and the fixed register 64, and may determine, based on a final operation value, whether a defect has occurred in the extra register 61.

Figure 7:
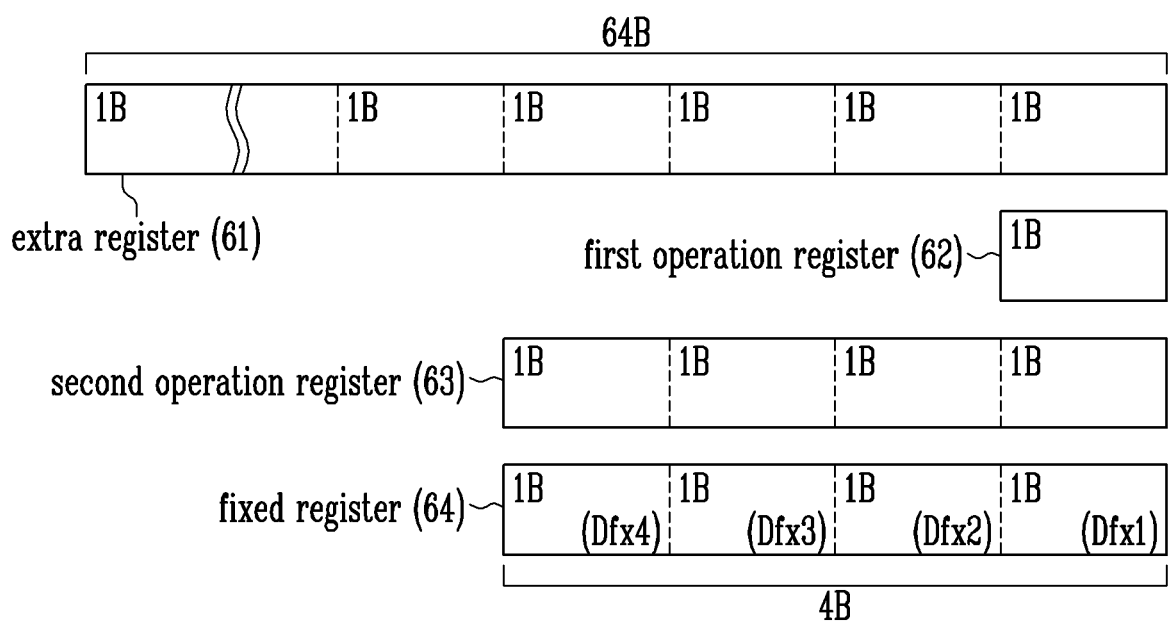
FIG. 7 is a diagram illustrating the storage capacities of storage devices in which data is stored.

FIG. 7 is a diagram illustrating the storage capacities of storage devices in which data is stored.

Referring to FIG. 7, in the present embodiment, the storage capacity of the extra register 61 may be equal to that of one page (e.g., PG # of FIG. 3). In other words, the storage capacity of the extra register 61 may be equal to that of the page buffer group 110. The storage capacity of the first operation register 62 may be less than that of the extra register 61, and the storage capacity of the second operation register 63 may be equal to that of the fixed register 64. The storage capacity of one of the second operation register 63 and the fixed register 64 may be less than that of the extra register 61 and is greater than that of the first operation register 62.

When the storage capacity of the page buffer group 110 is 64 bytes (64 B), the CAM data stored in the page buffer group 110 should be stored in the extra register 61 through a specific operation, and thus the extra register 61 may require the same storage capacity as the page buffer group 110. For example, the extra register 61 may have a storage capacity of a total of 64 bytes (64 B).

Since the data stored in the first operation register 62 may be the resulting data obtained by performing a first operation on 1-byte data of the extra register 61 and 1-byte data stored in the page buffer PBm, the first operation register 62 may have a storage capacity of 1 byte (1B).

Since the second operation register 63 may store resulting data of a CRC operation that uses, e.g., 32 pins, it may have a storage capacity of 4 bytes (4B) corresponding to 32 bits.

The fixed register 64 may have a storage capacity of 4 bytes (4B), and may store items of fixed data Dfx1 to Dfx4. The items of fixed data Dfx1 to Dfx4 are items of data that cause the resulting value of a final XOR operation to be '0' in the CRC operation on the CAM data stored in the CAM block 100 at the step of manufacturing the memory device, and are not deleted or changed after they are stored in the fixed register 64. The storage capacity of each of the items of fixed data Dfx1 to Dfx4 may be 1 byte (1B). The storage capacities of the above-described registers 61 to 64 are mere examples, and the present disclosure is not limited to the storage capacities of the present embodiment.

A method of checking a defect in the extra register 61 will be described in detail below.

Figure 8:
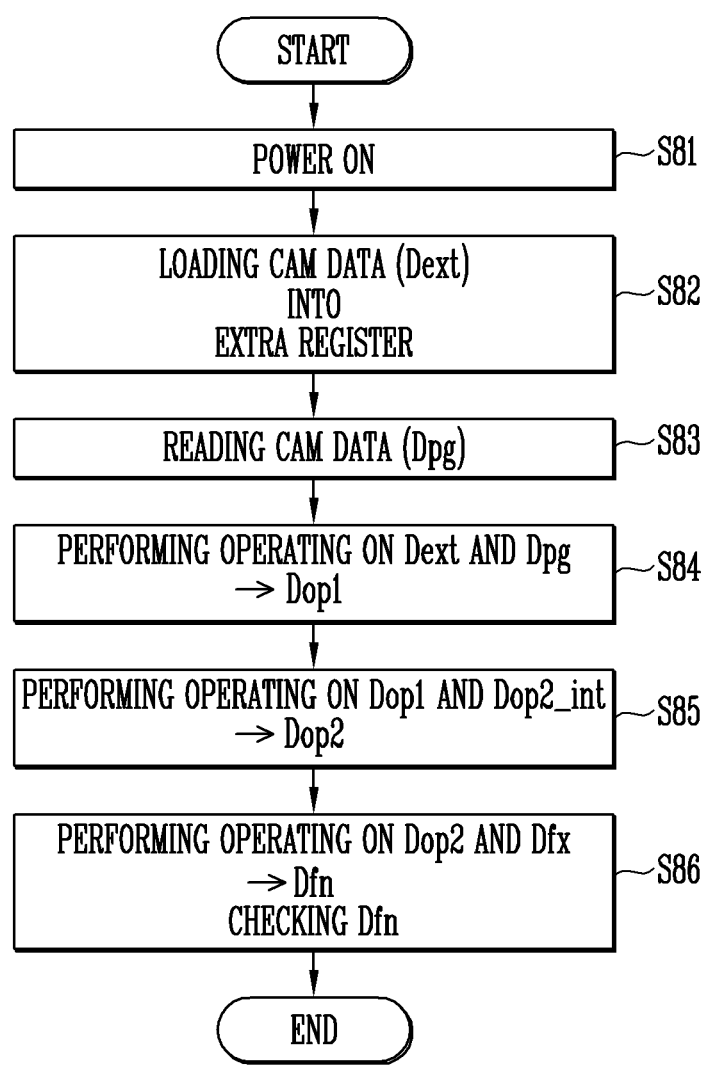
FIG. 8 is a flowchart illustrating a method of operating a memory device according to an embodiment.

FIG. 8 is a flowchart illustrating a method of operating a memory device according to an embodiment of the present disclosure. In FIG. 8, the defect check method according to the present embodiment is schematically illustrated, and detailed methods of respective operations described in FIG. 8 are described through FIGS. 9A to 13B.

Referring to FIG. 8, when power is supplied to a memory system (e.g., 1000 of FIG. 1), a controller (e.g., 1200 of FIG. 1) in the memory system 1000 may output a CAM read command for reading a CAM block to a memory device (e.g., 1100 of FIG. 1) at operation S81.

The operation logic (e.g., 66 of FIG. 6) of the memory device 1100 may read items of CAM data from the CAM block in response to the CAM read command, and may load resulting data, obtained by performing an XNOR operation on the items of read CAM data and the items of initial extra data iDext stored in an extra register 61, in the extra register (e.g., 61 of FIG. 6) at operation S82. For convenience of description, the CAM data loaded in the extra register 61 is defined as extra data Dext.

Then, the operation logic 66 may read again the items of CAM data from the CAM block and store the CAM data in a page buffer group at operation S83. In the following embodiments, the CAM data stored in the page buffer group is defined as page data Dpg.

When items of data are stored in the extra register and the page buffer group, respectively, the operation logic 66 may generate first operation data Dop1 by performing a first operation on the extra data Dext stored in the extra register and the page data Dpg stored in the page buffer group at operation S84. For example, the operation logic 66 may generate the first operation data Dop1 by performing an XNOR operation on the extra data Dext and the page data Dpg in units of 1 byte.

When the first operation data Dop1 is generated, the operation logic 66 may generate second operation data Dop2 by performing a second operation on initial second operation data Dop2_int stored in a second operation register 63 and the first operation data Dop1 at operation S85.

Then, the operation logic 66 may generate final data Dfn by performing an operation on the second operation data Dop2 and the fixed data Dfx, and may determine whether a defect has occurred in the extra register 61 by checking the final data Dfn at operation S86.

Individual operations of the above-described defect check method will be described in detail below.

Figure 9A:
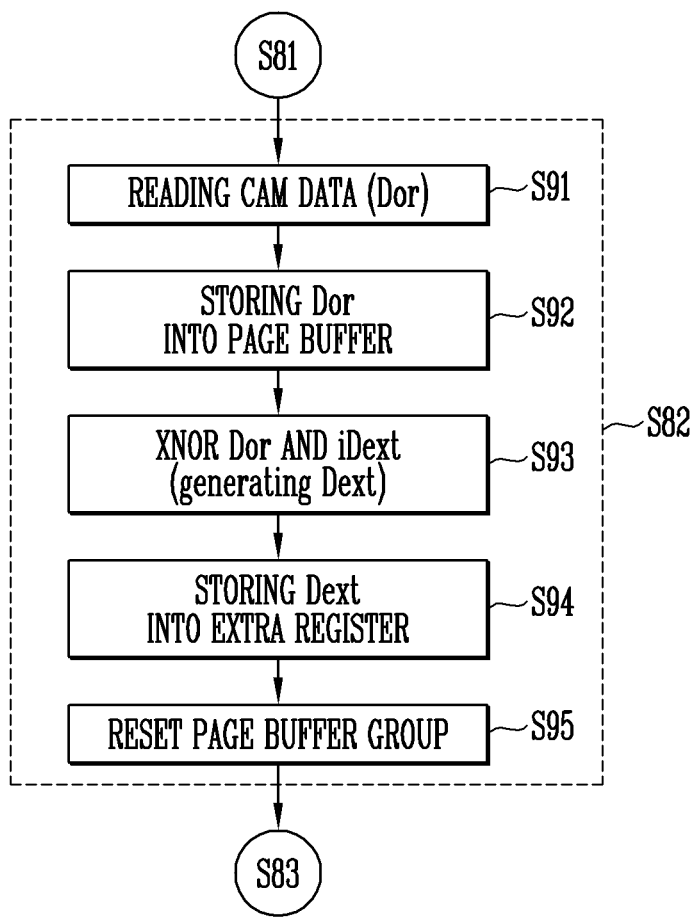
FIGS. 9A and 9B are diagrams illustrating in detail a CAM data loading operation of FIG. 8.
Figure 9B:
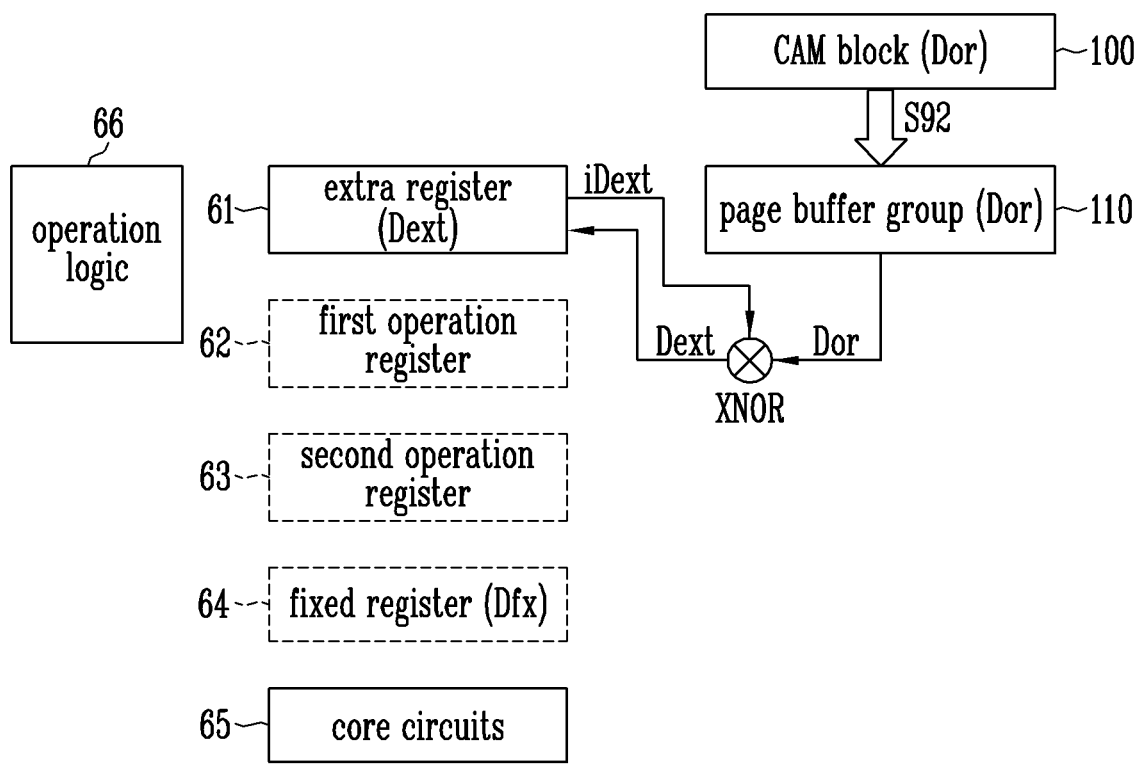

FIGS. 9A and 9B are diagrams illustrating in detail the CAM data loading operation of FIG. 8, wherein FIG. 9A is a flowchart illustrating in detail the operation S82 of FIG. 8 and FIG. 9B is a diagram illustrating in detail components which perform operation S82.

Referring to FIGS. 9A and 9B, the operation logic 66 may perform a CAM read operation on the CAM block 100 by controlling the core circuits 65 in response to a CAM read command at operation S91. For example, after the core circuits 65 have precharged the bit lines, they may perform the CAM read operation by applying a read voltage to a selected word line of the CAM block. For convenience of description, CAM data stored in the CAM block 100 is defined as original CAM data Dor. When the CAM read operation is performed, the CAM data may be stored in the page buffer group 110 coupled to the CAM block 100 at operation S92. For example, the core circuits 65 may sense voltages or currents of the bit lines determined depending on the threshold voltages of the CAM cells, and may then store the CAM data in the page buffer group 110.

Then, an XNOR operation may be performed on the CAM data stored in the page buffer group 110 and an initial extra data iDext stored in the extra register 61, and then extra data Dext may be generated at operation S93. The initial extra data iDext may be input to the extra register 61 during the manufacturing process of a memory device 1100. Since the extra data Dext is obtained by using the CAM data read from the CAM block 100 and the initial extra data iDext, characteristics of each memory device 1100 can be reflected to the extra data Dext. For example, the core circuits 65 may perform the XNOR operation under the control of the operation logic 66. The resulting data obtained from the operation may be the extra data Dext.

The extra data Dext may be stored in the extra register 61 at operation S94.

When the extra data Dext is stored in the extra register 61, the operation logic 66 may reset the page buffer group 110 by controlling the core circuits 65 at operation S95. For example, since the page buffer group 110 includes a plurality of page buffers, the CAM data may be stored in the plurality of page buffers when the CAM read operation is performed. Since each of the plurality of page buffers includes a plurality of latches and CAM data is stored in a latch selected from among the plurality of latches, latches in which CAM data is stored may be reset so that the latches have the same initial data during a reset operation.

Figure 10A:
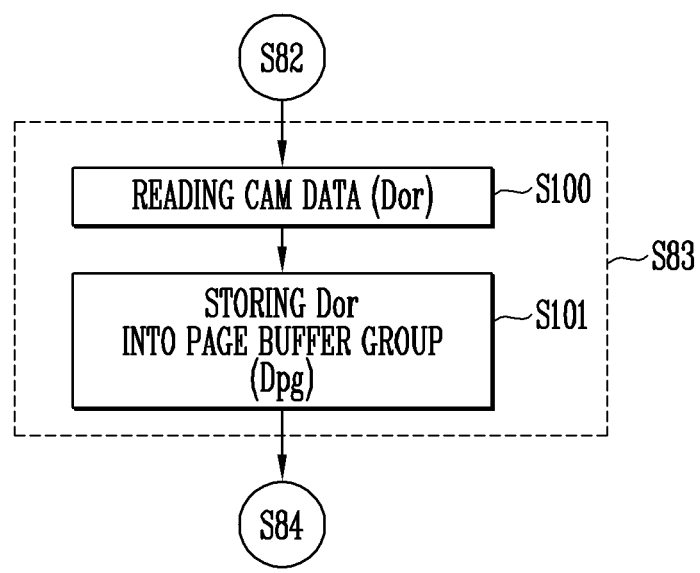
FIGS. 10A and 10B are diagrams illustrating in detail a CAM data read operation of FIG. 8.
Figure 10B:
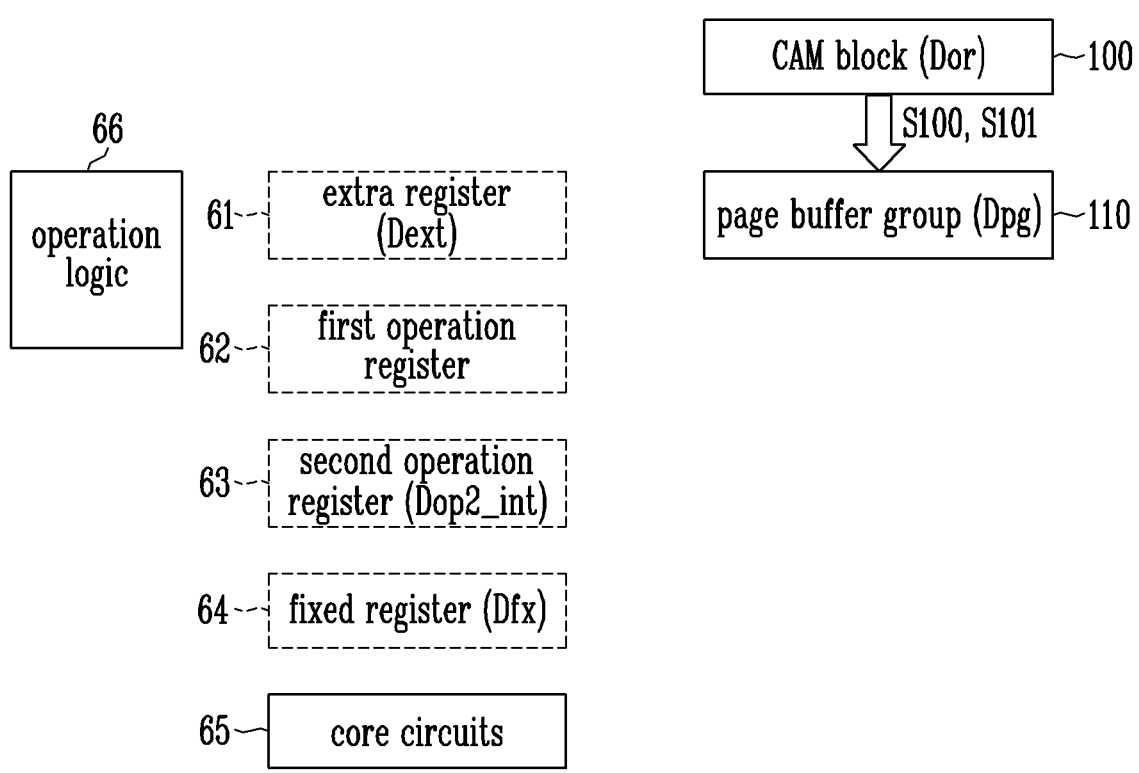

FIGS. 10A and 10B are diagrams illustrating in detail the CAM data read operation of FIG. 8. FIG. 10A is a flowchart illustrating in detail the operation S83 of FIG. 8, and FIG. 10B is a diagram illustrating in detail components which perform operation S83.

Referring to FIGS. 10A and 10B, when latches of the page buffer group 110 are reset, the core circuits 65 may perform again a CAM read operation on the CAM block 100 under the control of the operation logic 66 at operation S100. For example, after the core circuits 65 have precharged the bit lines, they may perform the CAM read operation by applying a read voltage to a selected word line of the CAM block. Then, the core circuits 65 may sense voltages or currents of bit lines, and may then store CAM data in the page buffer group 110 at operation S101. For convenience of description, the CAM data, stored again in the page buffer group 110, is defined as page data Dpg. Therefore, the original CAM data Dor is stored in the CAM block 100, the page data Dpg read through the CAM read operation is stored in the page buffer group 110, and extra data Dext is stored in the extra register 61.

Figure 11A:
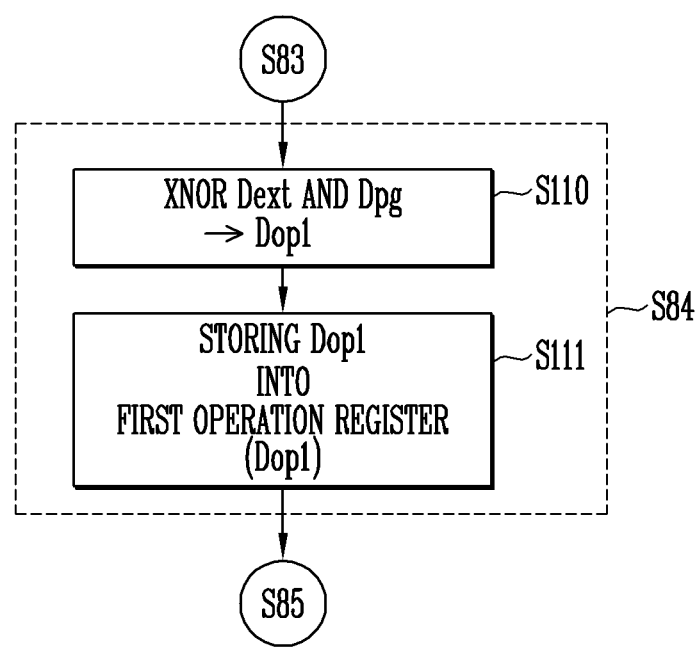
FIGS. 11A to 11C are diagrams illustrating generating of first operation data by performing an operation on CAM data stored in an extra register and read CAM data in FIG. 8.
Figure 11B:
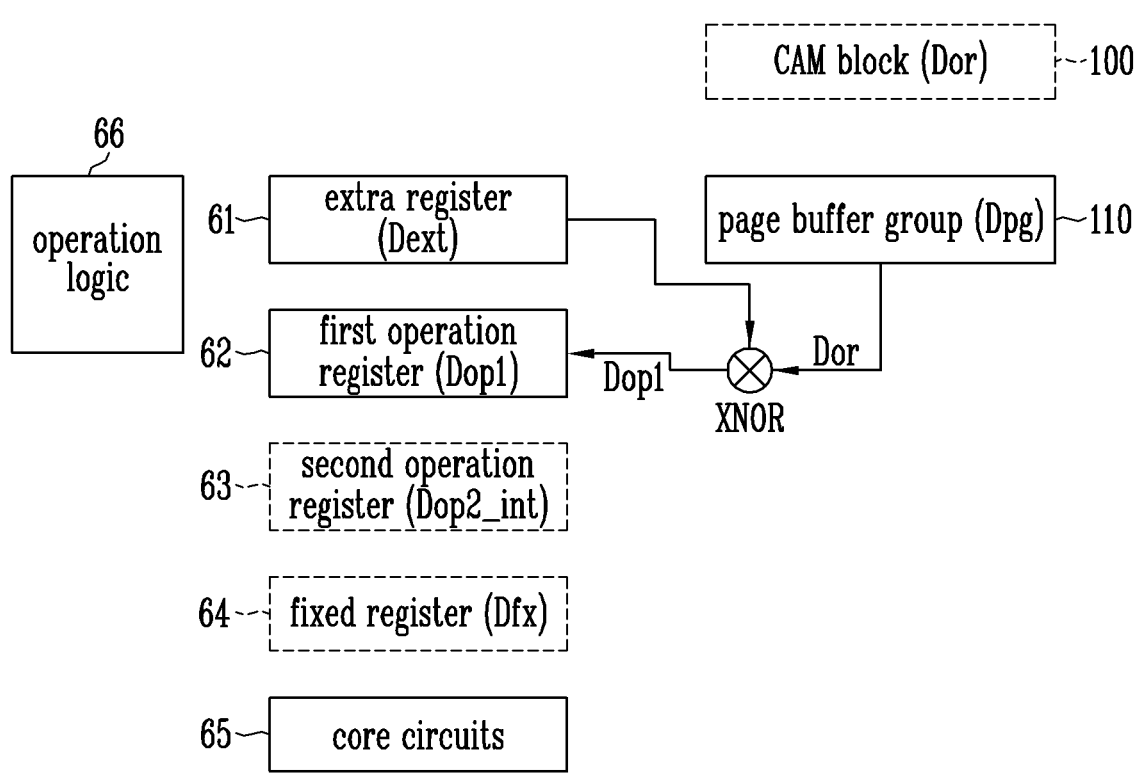
Figure 11C:
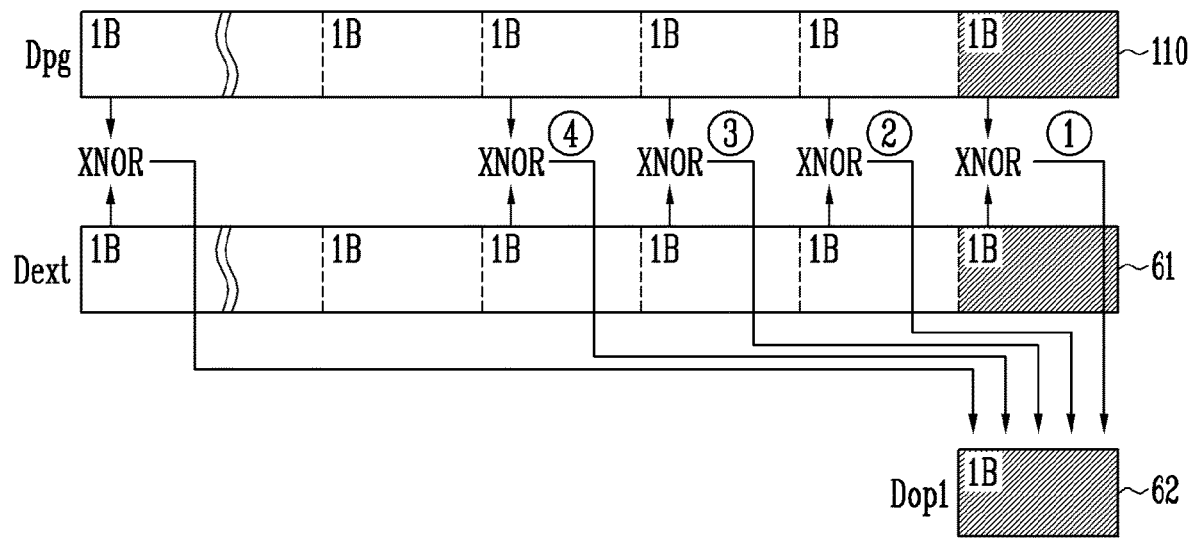

FIGS. 11A to 11C are diagrams illustrating in detail generating of first operation data by performing an operation on CAM data stored in the extra register and read CAM data in FIG. 8. FIG. 11A is a flowchart illustrating in detail the operation S84 of FIG. 8, FIG. 11B is a diagram illustrating in detail components which perform operation S84, and FIG. 11C is a diagram illustrating in detail the first operation data Dop1 stored in the first operation register 62.

Referring to FIGS. 11A to 11C, the operation logic 66 may generate 1-byte (1B) first operation data Dop1 by performing an XNOR operation on 1-byte (1B) extra data Dext and 1-byte (1B) page data Dpg, and may store the first operation data Dop1 in the first operation register 62 by controlling the core circuits 65. In the XNOR operation, when items of input data are identical to each other, a value of '1' is output, whereas when items of input data are different from each other, a value of '0' is output. Therefore, when the extra data Dext is identical to the page data Dpg, all of the first operation data Dop1 may be '1', whereas when different items of data are included among the extra data Dext and the page data Dpg, values of '0' and '1' may be included in the first operation data Dop1. The core circuits 65 may store the first operation data Dop1 in the first operation register 62.

In the first operation register 62, data obtained by performing an XNOR operation on items of data corresponding to selected addresses of the page buffer group 110 and the extra register 61 may be stored rather than by performing an XNOR operation on all of the page data Dpg and the extra data Dext and storing the results of the XNOR operation. For example, resulting data obtained by performing an XNOR operation on items of 1-byte (1B) data corresponding to first addresses of the page buffer group 110 and the extra register 61 may be stored in the first operation register 62 (①).

After the first operation data Dop1 stored in the first operation register 62 has been used in a next operation, the resulting data obtained by performing an XNOR operation on items of 1-byte (1B) data corresponding to second addresses of the page buffer group 110 and the extra register 61 may be stored in the first operation register 62 (①). In this way, resulting data obtained by sequentially performing XNOR operations on items of data corresponding to respective addresses of the page buffer group 110 and the extra register 61 may be stored in the first operation register 62.

Figure 12A:
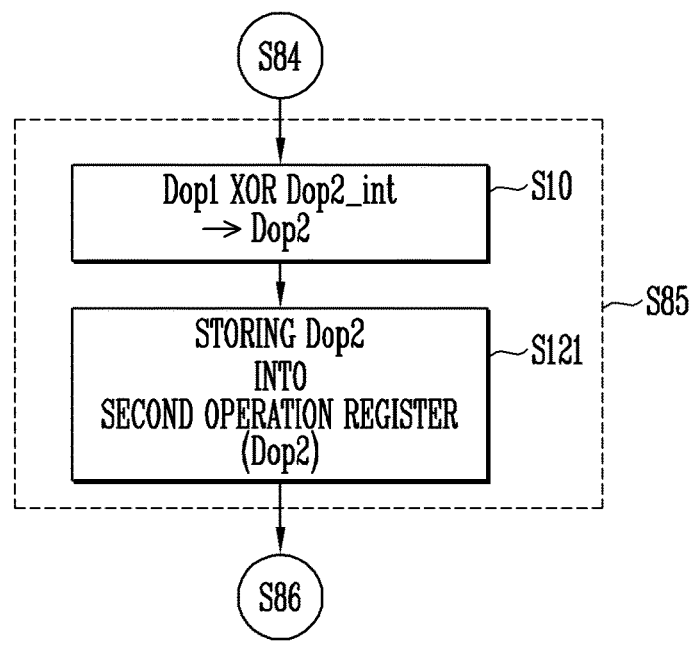
FIGS. 12A and 12B are diagrams illustrating generating of second operation data by performing an operation on the first operation data in FIG. 8.
Figure 12B:
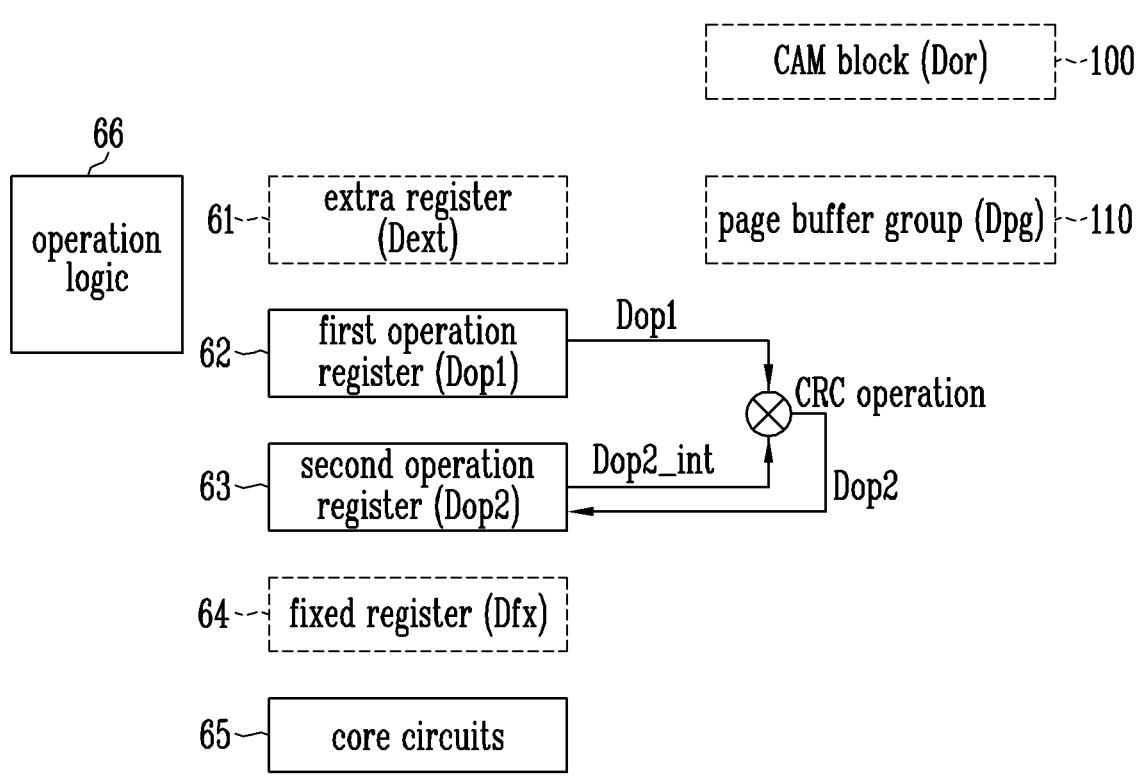

FIGS. 12A and 12B are diagrams illustrating in detail generating of second operation data by performing an operation on the first operation data in FIG. 8, wherein FIG. 12A is a flowchart illustrating in detail the operation S85 of FIG. 8 and FIG. 12B is a diagram illustrating in detail components which perform operation S85.

Referring to FIGS. 12A and 12B, to reduce the number of bits of first operation data Dop1, the operation logic 66 may generate second operation data Dop2 by performing an CRC operation on the first operation data Dop1 and initial second operation data Dop2_int. For example, the CRC operation is CRC-32 operation. For example, the initial second operation data Dop2_int may be stored in the second operation register 63. When the second operation data Dop2 is generated by performing an CRC operation on the first operation data Dop1 and the initial second operation data Dop2_int, the generated second operation data Dop2 may be stored in the second operation register 63. The CRC operation may comprise an XOR operation. In the XOR operation, when items of input data are identical to each other, a value of '0' is output, whereas when items of input data are different from each other, a value of '1' is output. Therefore, when the first operation data Dop1 and the initial second operation data Dop2_int are identical to each other, the second operation data Dop2 may be composed of data values of '0', whereas when the first operation data Dop1 and the initial second operation data Dop2_int are different from each other, the second operation data Dop2 may be composed of data values of '1'.

Figure 13A:
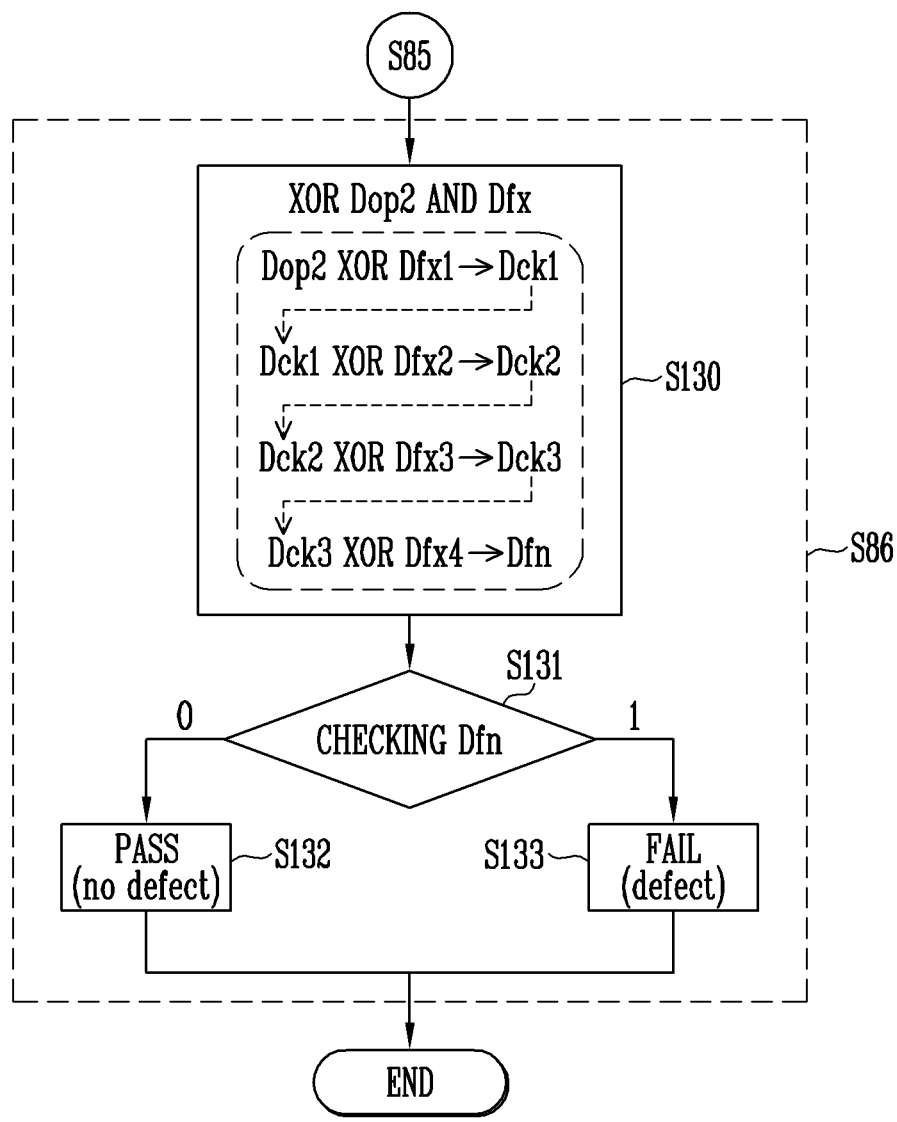
FIGS. 13A and 13B are diagrams illustrating checking of defects using the second operation data and fixed data in FIG. 8.
Figure 13B:
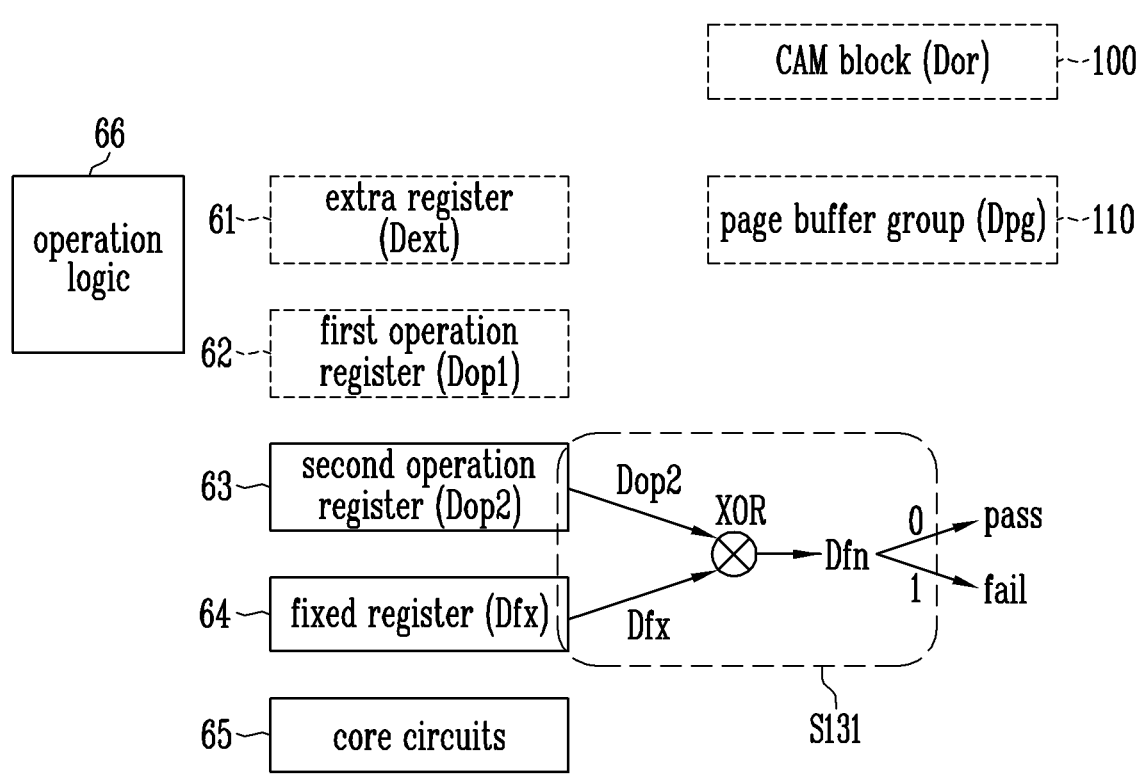

FIGS. 13A and 13B are diagrams illustrating in detail checking of defects using the second operation data and fixed data in FIG. 8, wherein FIG. 13A is a flowchart illustrating in detail the operation S86 of FIG. 8, and FIG. 13B is a diagram illustrating in detail components which perform operation S86.

Referring to FIGS. 13A and 13B, the operation logic 66 may generate final data Dfn by sequentially performing XOR operations on second operation data Dop2 stored in the second operation register 63 and fixed data Dfx stored in the fixed register 64 at operation S130. Here, the fixed data Dfx may be data prestored in the fixed register 64 at the manufacturing step of the memory device, and may be data that causes the resulting value of a final XOR operation to be '0' in a cyclic redundancy check (CRC) operation performed in advance on the CAM data, which is error-free when stored in the CAM block 100. As described above with reference to FIG. 7, when the fixed data Dfx is composed of items of first to fourth fixed data Dfx1 to Dfx4, a total of four operations may be performed by sequentially using the items of first to fourth fixed data Dfx1 to Dfx4. For example, the operation logic 66 may generate first check data Dck1 by performing an XOR operation on the second operation data Dop2 and the first fixed data Dfx1, generate second check data Dck2 by performing an XOR operation on the first check data Dck1 and the second fixed data Dfx2, generate third check data Dck3 by performing an XOR operation on the second check data Dck2 and the third fixed data Dfx3, and generate final data Dfn by performing an XOR operation on the third check data Dck3 and the fourth fixed data Dfx4.

When the final data Dfn is generated, the operation logic 66 may determine, based on the final data Dfn, whether a defect has occurred in the extra data at operation S131. When it is determined that the final data Dfn has a value of '0', the operation logic 66 may determine that no defect has occurred in the extra data of the selected address at operation S132. For example, when data obtained through an operation performed on the extra data of the first address within the extra register 61 is stored in the first and second operation registers 62 and 63, whether a defect has occurred in the extra data of the first address within the extra register 61 may be determined based on the final data Dfn. For example, when the final data Dfn is '0', it may be determined that the defect check operation has passed. This means that no defect has occurred in the extra data of the first address within the extra register 61. When the final data Dfn is '1', it may be determined that the defect check operation has failed. This means that a defect has occurred in the extra data of the first address within the extra register 61.

In this way, defect check operations may be sequentially performed on the extra data of all addresses within the extra register 61. Based on the sequentially generated final data Dfn, whether a defect has occurred in the extra data stored in the extra register 61 may be determined, and an address at which a defect has occurred in the extra data stored in the extra register 61 may also be determined.

The operation logic 66 may output a resulting signal to an external device based on the result of the determination. The external device may be the controller (e.g., 1200 of FIG. 1) or a test device. When a defect has occurred in the extra register 61, the memory device (e.g., 1100 of FIG. 1) including the extra register 61 may be processed as a fail.

Figure 14:
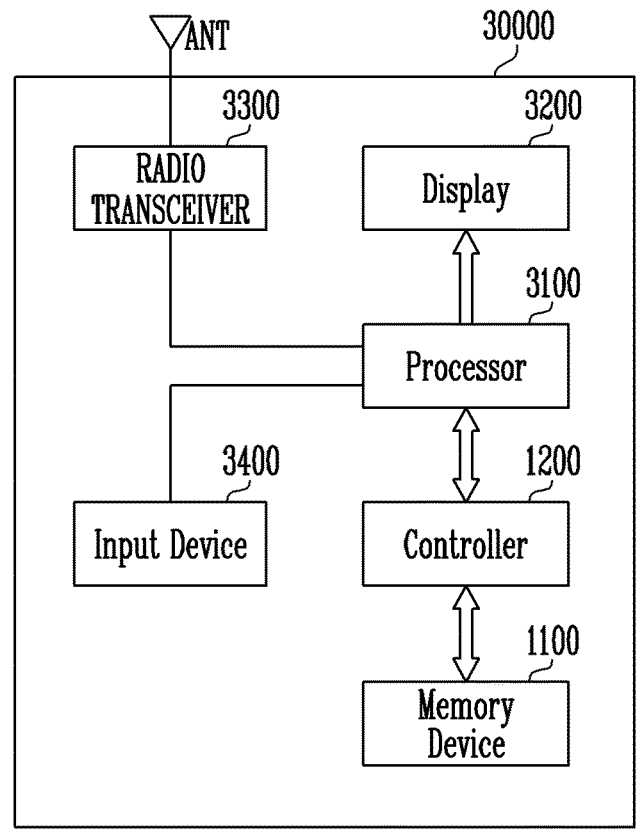
FIG. 14 is a diagram illustrating a memory system including a memory device according to an embodiment.

FIG. 14 is a diagram illustrating a memory system including a memory device according to the present disclosure.

Referring to FIG. 14, a memory system 30000 may be implemented as a cellular phone, a smart phone, a tablet PC, a personal digital assistant (PDA) or a wireless communication device. The memory system 30000 may include a memory device 1100 and a controller 1200 which is capable of controlling the operation of the memory device 1100.

The controller 1200 may control a data access operation for the memory device 1100, for example, a program operation, an erase operation or a read operation, under the control of a processor 3100.

Data programmed to the memory device 1100 may be output via a display 3200 under the control of the controller 1200.

A radio transceiver 3300 may exchange radio signals through an antenna ANT. For example, the radio transceiver 3300 may convert radio signals received through the antenna ANT into signals that may be processed by the processor 3100. Therefore, the processor 3100 may process the signals output from the radio transceiver 3300, and may transmit the processed signals to the controller 1200 or the display 3200. The controller 1200 may transmit the signals processed by the processor 3100 to the memory device 1100. Further, the radio transceiver 3300 may convert signals output from the processor 3100 into radio signals, and output the radio signals to an external device through the antenna ANT. An input device 3400 may be used to input a control signal for controlling the operation of the processor 3100 or data to be processed by the processor 3100. The input device 3400 may be implemented as a pointing device such as a touch pad, a computer mouse, a keypad or a keyboard. The processor 3100 may control the operation of the display 3200 so that data output from the controller 1200, data output from the radio transceiver 3300, or data output from the input device 3400 is output via the display 3200.

In an embodiment, the controller 1200 that is capable of controlling the operation of the memory device 1100 may be implemented as a part of the processor 3100 or as a chip provided separately from the processor 3100.

Figure 15:
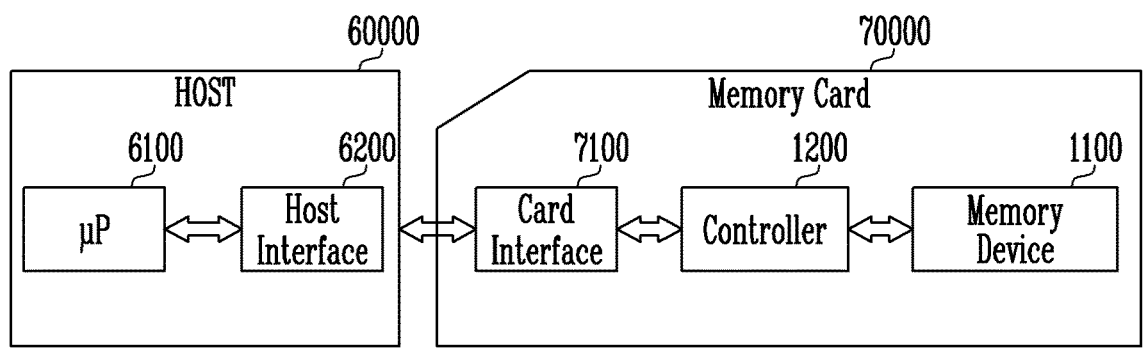
FIG. 15 is a diagram illustrating a memory system including a memory device according to an embodiment.

FIG. 15 is a diagram illustrating a memory system including a memory device according to the present disclosure.

Referring to FIG. 15, a memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In an embodiment, the card interface 7100 may be, but is not limited to, a secure digital (SD) card interface or a multimedia card (MMC) interface.

Data programmed to the memory device 1100 may be output via the card interface 7100 under the control of the controller 1200.

The card interface 7100 may interface data exchange between a host 60000 and the controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method supported by the card interface 7100.

When the memory system 70000 is coupled to a host interface 6200 of the host 60000 such as a PC, a tablet PC, a digital camera, a digital audio player, a mobile phone, console video game hardware or a digital set-top box, the host interface 6200 may perform data communication with the memory device 1100 through the card interface 7100 and the controller 1200 under the control of a microprocessor (μP) 6100.

The present disclosure may check defects, occurring in an extra register into which data in a CAM block is loaded, within a memory device, thus improving the reliability of the memory device.

While the present disclosure has been described with respect to specific embodiments, it will be apparent to those skilled in the art that various changes and modifications may be made without departing from the spirit and scope of the invention as defined in the following claims.

What is claimed is:

1. A memory device, comprising:
   a content-addressable memory (CAM) block configured to store CAM data used for an operation of the memory device;
   a page buffer group configured to store the CAM data read from the CAM block as page data;
   an extra register configured to store extra data generated based on the CAM data; and
   an operation logic configured to output final data indicating a presence or an absence of a defect in the extra register based on an operation on the extra data, the page data, and fixed data corresponding to a value of a cyclic redundancy check (CRC) performed on the CAM data stored in the CAM block.

2. The memory device according to claim 1, wherein the CAM block comprises a plurality of CAM cells that are capable of storing the CAM data, and is coupled to the page buffer group through a plurality of bit lines coupled to the CAM cells.

3. The memory device according to claim 2, wherein:
   the page buffer group comprises a plurality of page buffers coupled to the bit lines, respectively, and
   each of the plurality of page buffers comprises a latch configured to store the CAM data.

4. The memory device according to claim 1, wherein the page buffer group and the extra register are each configured to have a storage capacity of one page included in the CAM block.

5. The memory device according to claim 1, wherein the operation logic is configured to:
   generate the extra data by performing an XNOR operation on the CAM data and initial extra data,
   generate first operation data by performing the XNOR operation on the extra data stored in the extra register and the CAM data,
   generate second operation data by performing a CRC operation on the first operation data and initial second operation data, and
   generate the final data by performing an XOR operation on the second operation data and the fixed data.

6. The memory device according to claim 5, further comprising:
   a first operation register configured to store the first operation data; and
   a second operation register configured to store the initial second operation data or the second operation data.

7. The memory device according to claim 6, further comprising:
   a fixed register configured to store the fixed data,
   wherein a storage capacity of the first operation register is equal to a storage capacity corresponding to a selected address of the extra register, and
   wherein a storage capacity of the second operation register is equal to a storage capacity of the fixed register.

8. The memory device according to claim 7, wherein the storage capacity of the fixed register is greater than the storage capacity of the first operation register and is less than the storage capacity of the extra register.

9. The memory device according to claim 1, wherein the fixed data is data causing a resulting value of a final XOR operation to be '0' in a CRC operation that is performed in advance on the CAM data, which is error-free.

10. The memory device according to claim 5, wherein the operation logic is configured to:
   determine that no defect has occurred in the extra register, when only non-defective data is included in the final data, and
   determine that a defect has occurred in the extra register, when defective data is included in the final data.

11. The memory device according to claim 10, wherein the operation logic is configured to:
   output a signal indicating that no defect has occurred to an external device, when it is determined that no defect has occurred in the extra register, and
   output a signal indicating that the defect has occurred to the external device, when it is determined that the defect has occurred in the extra register.

12. The memory device according to claim 1, further comprising:
   core circuits configured to generate an operating voltage to be applied to a word line coupled to the CAM block.

13. A method of operating a memory device, comprising:
   storing, in a fixed register, fixed data corresponding to a value of a cyclic redundancy check (CRC) that is performed in advance on CAM data stored in a CAM block;
   generating extra data by performing an operation on the CAM data read from the CAM block, and storing the extra data in an extra register;
   storing, as page data, the CAM data read from the CAM block in a page buffer group;
   generating first operation data by performing an operation on the extra data and the page data;
   generating second operation data by performing an operation on the first operation data and initial second operation data;
   generating final data by performing an operation on the second operation data and the fixed data; and
   determining whether a defect has occurred in the extra register depending on the final data.

14. The method according to claim 13, wherein storing the extra data in the extra register comprises:
   reading the CAM block;
   storing the read CAM data in a page buffer group coupled to the CAM block; and
   generating the extra data by performing an XNOR operation on the CAM data stored in the page buffer group, and transferring the extra data to the extra register.

15. The method according to claim 13, further comprising resetting the page buffer group between storing the extra data in the extra register and storing the page data in the page buffer group.

16. The method according to claim 15, wherein the page buffer group is reset so that all page buffers included in the page buffer group have identical initial data.

17. The method according to claim 13,
   wherein the first operation data is generated by performing an XNOR operation on the extra data stored at a selected address of the extra register, and the page data stored at the selected address of the page buffer group, and
   wherein the extra data and the page data have an equal size.

18. The method according to claim 13, wherein the second operation data is generated by performing a cyclic redundancy check (CRC) operation on the initial second operation data and the first operation data.

19. The method according to claim 18, wherein the second operation data is stored again in a second operation register in which the initial second operation data is stored.

20. The method according to claim 13, wherein generating the final data comprises:
   generating first check data by performing an XOR operation on first fixed data included in the fixed data, and the second operation data;
   generating second check data by performing an XOR operation on second fixed data included in the fixed data, and the first check data; and
   generating the final data by sequentially performing XOR operations on remaining fixed data included in the fixed data, and check data generated in a previous operation.

21. The method according to claim 13, wherein the determining includes:
   determining that no defect has occurred in the extra register, when only non-defective data is included in the final data, and
   determining that the defect has occurred in the extra register, when defective data is included in the final data.

* * * * *